US006442039B1

(12) United States Patent
Schreiber

(10) Patent No.: US 6,442,039 B1
(45) Date of Patent: Aug. 27, 2002

(54) METALLIC MICROSTRUCTURE SPRINGS AND METHOD OF MAKING SAME

(75) Inventor: Chris M. Schreiber, Lake Elsinore, CA (US)

(73) Assignee: Delphi Technologies, Inc., Troy, MI (US)

(*) Notice: Subject to any disclaimer, the term of this patent is extended or adjusted under 35 U.S.C. 154(b) by 0 days.

(21) Appl. No.: 09/454,804

(22) Filed: Dec. 3, 1999

(51) Int. Cl.[7] .......................... H05K 7/02; H05K 7/06; H05K 7/08; H05K 7/10

(52) U.S. Cl. .......................................... 361/760; 439/66

(58) Field of Search ............................ 439/66, 91, 591; 361/760; 29/874, 885, 884

(56) References Cited

U.S. PATENT DOCUMENTS

| | | | | | |
|---|---|---|---|---|---|
| 4,116,517 | A | | 9/1978 | Selvin et al. | |
| 4,597,177 | A | | 7/1986 | Baldauf et al. | 29/878 |
| 4,650,723 | A | * | 3/1987 | Furuya | 428/622 |
| 4,662,702 | A | * | 5/1987 | Furuya | 439/630 |
| 4,749,120 | A | | 6/1988 | Hatada | 228/175 |
| 4,862,588 | A | | 9/1989 | MacKay | 29/884 |
| 4,878,990 | A | | 11/1989 | Dugan et al. | 156/630 |
| 4,893,172 | A | | 1/1990 | Matsumoto et al. | 23/36 |
| 4,991,290 | A | | 2/1991 | MacKay | 29/884 |
| 5,086,337 | A | | 2/1992 | Yoro et al. | 357/79 |
| 5,152,695 | A | * | 10/1992 | Grabbe et al. | 439/66 |
| 5,161,403 | A | | 11/1992 | Kitchens | 72/414 |
| 5,178,693 | A | * | 1/1993 | Miyakusu et al. | 148/580 |
| 5,207,887 | A | | 5/1993 | Crumly et al. | 205/78 |
| 5,230,632 | A | * | 7/1993 | Baumberger et al. | 439/66 |
| 5,245,750 | A | | 9/1993 | Crumly et al. | 29/840 |
| 5,346,857 | A | | 9/1994 | Scharr et al. | 437/183 |
| 5,431,328 | A | | 7/1995 | Chang et al. | 228/180.22 |
| 5,462,440 | A | * | 10/1995 | Rothenberger | 439/66 |
| 5,477,087 | A | | 12/1995 | Kawarita et al. | 257/737 |
| 5,529,504 | A | * | 6/1996 | Greenstein et al. | 439/91 |
| 5,632,631 | A | * | 5/1997 | Fjelstad et al. | 439/66 |
| 5,642,261 | A | | 6/1997 | Bond et al. | 361/704 |
| 5,665,654 | A | | 9/1997 | Stansbury | 438/23 |
| 5,686,190 | A | * | 11/1997 | Mennucci et al. | 428/472 |
| 5,763,941 | A | | 6/1998 | Fjelstad | 257/669 |
| 5,790,377 | A | | 8/1998 | Schreiber et al. | 361/704 |
| 5,795,818 | A | | 8/1998 | Marrs | 438/612 |
| 5,812,378 | A | | 9/1998 | Fjelstad et al. | 361/769 |
| 5,984,691 | A | * | 11/1999 | Brodsky et al. | 439/66 |
| 6,007,349 | A | * | 12/1999 | Distefano et al. | 439/66 |
| 6,029,344 | A | * | 2/2000 | Khandros et al. | 29/874 |
| 2001/0011907 | A1 | * | 8/2001 | Farnworth et al. | 254/765 |

FOREIGN PATENT DOCUMENTS

| | | |
|---|---|---|
| EP | 0393 584 | 10/1990 |

OTHER PUBLICATIONS

Tummala etal, Microelectronics Packaging Handbook, pp. 409–435 No date.

* cited by examiner

*Primary Examiner*—Tulsidas Patel
*Assistant Examiner*—Hae Moon Hyeon
(74) *Attorney, Agent, or Firm*—Thomas N. Twomey

(57) ABSTRACT

A spring suitable for use in interposers such as those used to electrically interconnect electronic devices such as integrated circuits and printed wiring boards. The spring includes a central portion, a peripheral portion and a plurality of bent legs extending between the central portion and the peripheral portion. The bent legs optionally comprise alternating layers of copper and nickel. At least ode protuberance is preferably formed upon either side of the generally planar spring so as to facilitate electrical contact with desired electrical contacts of the devices to be interconnected.

61 Claims, 7 Drawing Sheets

METALLIC MICROSTRUCTURE SPRINGS AND METHOD OF MAKING SAME

TECHNICAL FIELD

The present invention relates generally to microstructures. The present invention relates more particularly to a metallic microstructure spring and method for making the same, wherein the metallic microstructure spring is suitable for use as a spring terminus for interconnecting electronic devices such as printed wiring boards and integrated circuits.

BACKGROUND OF THE INVENTION

Methods for attaching integrated circuits and the like to printed wiring boards (PWBs) are well-known. Such methods enable the fabrication of various electronic subassemblies, such as motherboards and daughterboards for personal computers.

Contemporary methods for attaching integrated circuits to printed wiring boards involve the use of various integrated circuit packaging technologies such as dual in-line package (DIP), plastic lead chip carrier (PLCC), ceramic pin grid array (CPGA), plastic quad flat pack (PQFP), quad flat pack (QFP), tape carrier package (TCP), ball grid array (BGA), thin small outline package gull-wing (TSOP), small outline package J-lead (SOJ), shrink small outline package gull-wing (SSOP) and plastic small outline package (PSOP).

According to DIP packaging technology, the two parallel rows of leads extending from the integrated circuit package pass through holes formed in the printed wiring board and are soldered into the holes. Optionally, a socket may be utilized.

Integrated circuits packaged according to PLCC and CPGA technologies typically require the use of a socket.

PQFP, QFP, TCP, BGA, TSOP, SOJ, SSOP and PSOP are examples of surface mount technology, wherein the packaged integrated circuit is attached directly to a printed wiring board, typically by such techniques as re-flow soldering and/or thermal compression.

For example, BGAs comprise a plurality of electrical contacts formed so as to define a 2-dimensional array upon the bottom surface of an integrated circuit package. Each electrical contact of the BGA comprises a small ball of solder which generally facilitates permanent interconnection of the integrated circuit to a complimentary array of flat electrical contact pads formed upon a printed wiring board. The small solder balls melt during reflow soldering to effect such permanent connection of the integrated circuit to the printed wiring board.

As the number of transistors formed upon a single integrated circuit increases, the attachment of the integrated circuit to a printed wiring board or the like becomes more difficult. This is because integrated circuits having more transistors are more complex and thus generally required more communications pathways to other circuitry. It is expected that the number of transistors formed upon a single integrated circuit will increase from its present number of approximately 80 million to approximately 100 million by the year 2000.

BGAs support high pin counts, so as to facilitate the use of integrated circuits having a large number of transistors formed thereon. By taking advantage of the comparatively large surface area on the bottom of an integrated circuit package, ball grid arrays provide for a comparatively large number of electrical interconnections between the integrated circuit and a printed wiring board.

One problem, which is typically associated with the attachment of integrated circuits and the like to substrates such as printed circuit boards, particularly for ball grid arrays and similar technologies, is associated with the use of materials, having different temperature coefficients of expansion, in the integrated circuits and the substrates. As those skilled in the art will appreciate, the different materials used in the manufacture and/or packaging of integrated circuits and the fabrication of printed circuit boards tend to have different temperature coefficients of expansion. For example, the epoxy or ceramic material of an integrated circuit package has a different coefficient of expansion from the phenolic or epoxy material of a printed circuit board.

Thus, when temperature changes occur, the integrated circuit and the printed circuit board do not tend to expand or contract at the same rate. Such different rates of contraction and expansion result in a dimensional mismatch which may introduce undesirable stress concentrations in permanent interconnections, such as those resulting from the use of soldered joints and the like. Such undesirable stress concentrations may result in the formation of cracks in the interconnections. These cracks may eventually lead to failure of the interconnect to provide desired conductivity or electrical connection, thereby potentially resulting in failure of the entire electrical subassembly.

The effects of such temperature coefficient of expansion mismatches are particularly important in light of the fact that temperature changes are common in many electrical assemblies. Temperature changes typically occur in such electrical assemblies during power-up and power-down of the electrical assembly, as well as during normal environmental temperature changes. It should be appreciated that heat from the power supply, nearby electrical components and the integrated circuit itself may contribute substantially to such temperature changes. In view of the foregoing, it is desirable to provide techniques for mitigating the undesirable consequences of such mismatches of the temperature coefficient of expansion between the integrated circuits and printed circuit board.

Another problem typically associated with the attachment of integrated circuits and the like to substrates, such as printed wiring boards is that of poor electrical connection due to manufacturing tolerances which permit some of the individual connections to be inadequately conductive. Such inadequate conductivity results when one or more of the contacts of either the integrated circuit package or the printed wiring board is not flush or coplanar with the other contacts, such that the non-coplanar contact does not extend sufficiently far from the integrated circuit or printed wiring board to facilitate proper mechanical connection with its mating contact.

As used herein, the term Aintegrated circuit package@ is defined to include any device having electrical contacts formed thereupon for electrically interconnecting the integrated circuit die to a substrate. Such integrated circuit packages include chip-scale packaging (CSP), land grid array (LGA) packaging and ball grid array (BGA) packaging.

It is necessary for such mating contacts to be urged together with a sufficient amount of force to provide good mechanical interconnection thereof, so as to assure adequate electrical conductivity therebetween. In many instances, it is also necessary that sufficient force be provided so as to cause one of the contacts to penetrate an oxide layer of another of the contacts. In any instance, sufficient force is necessary so as to cause the contacts to abut over sufficient surface area at the mating interface thereof to provide the desired electrical conductivity therebetween.

Inadequate electrical connection of the mating contacts of an integrated circuit and a printed wiring board result in signal degradation, which may render the assembly inoperative.

While it is possible to improve the manufacturing tolerances of such devices as integrated circuits and printed wiring boards so as to mitigate the problems associated with inadequate electrical conduction, it is generally not desirable to do so because of the costs associated therewith. As those skilled in the art will appreciate, improving the tolerances of such devices so as to cause the electrical contacts thereof to be more nearly coplanar with one another involves substantial further processing and/or quality control. Such manufacturing procedures may, indeed, be cost prohibitive.

Interposers are frequently used in an attempt to mitigate the problems caused by inadequate electrical conductivity between the contacts of such devices as integrated circuits and printed wiring boards. Interposers typically comprise generally planar substrates having electrical contacts on each side thereof and having an electrical conduit between corresponding pairs of electrical contacts, so as to facilitate electrical communication therebetween. The planar substrate is formed so as to be flexible and the contacts are formed so as to be resilient or springy. The flexibility of the substrate compensates for differences in the height of the electrical contacts of the integrated circuit package and/or the printed wiring board. The resiliency of the contacts compensates for differences in the distance between complimentary pairs of contacts upon integrated circuit and packages and printed wiring boards and also assure adequate spring biasing force between the contacts of the interposer and the contacts of the integrated circuit package and/or printed wiring board. Interposers thus facilitate the use of devices such as integrated circuits and/or printed wiring boards having poor manufacturing tolerances while assuring adequate electrical connections therewith.

However, although such contemporary metal laden elastomeric interposers have proven generally suitable for their intended purpose, contemporary interposers do suffer from substantial deficiencies. Contemporary interposers generally comprise contacts having an elastomeric member which provides the resiliency or conforming property thereof, so as to allow the contacts of the interposer to compensate for differences in the height of the contacts of the integrated circuit package and/or printed wiring board.

When such an elastomeric member is exposed to substantial compression over an extended period of time, such as when the interposer is in use, then the elastomeric properties thereof may tend to degrade in a manner which substantially mitigates the resiliency thereof. That is, over time the elastomer may tend to break down and lose at least a portion of its spring force, such that the elastomer no longer urges the contacts of the interposer toward the contacts of the integrated circuit package and/or the contacts of the printed wiring board with sufficient force to assure adequate electrical conductivity therebetween.

As such, it is sometimes desirable to avoid the use of such elastomers in the construction of interposers, at least insofar as the elastomer is used to effect spring biasing of the electrical contacts of the interposer toward the electrical contacts of the integrated circuit package and/or the electrical contacts of the printed wiring board.

Further, conductive elastomers tend to have an undesirably higher contact resistance than direct metallic contacts. The bulk resistance of conductive elastomers is also undesirably higher than that of corresponding metal contacts. The contact resistance and bulk resistance of conductive elastomers places a constraint upon the smallest pitch size which is acceptable in an array of such contacts. That is, the pitch size must be sufficient to facilitate the fabrication of conductive contacts having a large enough size so as to provide an acceptable contact resistance and bulk resistance.

Metal springs do not tend to degrade substantially when compressed over extended periods of time. Further, metal springs used as electrical contacts do not have an undesirably high contact resistance and/or an undesirably high bulk resistance, and therefore do not impose the above undesirable constraints upon the size to which the pitch of such contacts may be reduced in an array. However, it is difficult to manufacture metal springs which are sufficiently small as to be capable of providing the desired electrical contact between electrical devices such as an integrated circuit and a printed wiring board and which are also capable of providing sufficient force so as to assure adequate electrical conductivity therebetween.

Because of the high density of electrical contacts on the package of contemporary integrated circuits, it is necessary that each electrical contact be very small. Many contemporary integrated circuits have between approximately 200 and approximately 2,000 input/output contacts formed thereon. These electrical contacts are typically formed in a pattern having a distance of 1.27 mm therebetween, center-to-center. Emerging LGA and BGA technologies utilize electrical contacts formed in a pattern having a distance of 1 mm therebetween, center-to-center. Minimalist packages utilizing electrical contacts formed in a pattern having distances of 0.5 mm to 0.8 mm, center-to-center, are commonly used in such applications as Rambus Dynamic Random Access Memory (RDRAM) devices.

Because of their small size, it is extremely difficult to form metallic springs having sufficient spring force to effect desired electrical conductivity. It is also difficult to form very small arrays of metallic springs which are positioned or juxtaposed sufficiently close to one another to serve as electrical contacts for the interconnection of integrated circuits and the like. For example, it is possible to construct very small springs utilizing hardened phosphor bronze or beryllium copper. However, the phosphor bronze or beryllium copper must be hardened after it has been formed into the desired spring shape. Contemporary microstructure spring forming processes which include techniques such as photolithography and electrodeposition require that the spring be formed upon the substrate of an interposer or the like. Such interposer substrates comprise a polymer material, such as a polyimide film or a polyester film. One example of such a film is KAPTON (a registered trademark of E.I. du Pont de Nemours and Company of Circleville, Ohio).

Thus, such contemporary methodologies necessitate that phosphor bronze or beryllium copper springs be hardened in situ, upon the polymer substrate. However, as those skilled in the art will appreciate, the temperatures to which the phosphor bronze or beryllium copper must be raised in order to effect hardening are not compatible with the polymer substrate. Such elevated temperatures cause degradation of the polymer substrate which renders it incapable of functioning in its intended use.

In view of the foregoing, it is desirable to provide an interposer having metallic springs which are capable of being manufactured utilizing contemporary manufacturing techniques and which are capable of providing adequate electrical conductivity of electrical connections made therewith.

SUMMARY OF THE INVENTION

The present invention specifically addresses and alleviates the above-mentioned deficiencies associated with the prior art. More particularly, the present invention comprises a microstructure spring formed by applying a photoresist to a substrate; aligning a mask with the substrate, the mask defining a pattern representative of a spring; exposing the substrate to electromagnetic radiation, such as ultraviolet light, so as to polymerize the photoresist, thereby allowing the masked areas to develop away and removing an undeveloped portion of the photoresist. Alternating layers of copper and nickel are then formed upon the substrate, such as by electrodeposition. The developed photoresist is then removed and the alternating layers of copper and nickel formed upon the substrate where the photoresist was absent define the spring.

As those skilled in the art will appreciate, this process facilitates the fabrication of microcomposite springs which are suitable for use in applications such as the spring biasing of electrical contacts of an interposer which is used to attach electrical devices such as the packages of integrated circuits and printed wiring boards to one another.

These, as well as other advantages of the present invention will be more apparent from the following description and drawings. It is understood that changes in the specific structure shown and described may be made within the scope of the claims without departing from the spirit of the invention.

DESCRIPTION OF THE PREFERRED EMBODIMENT

Figure 1:
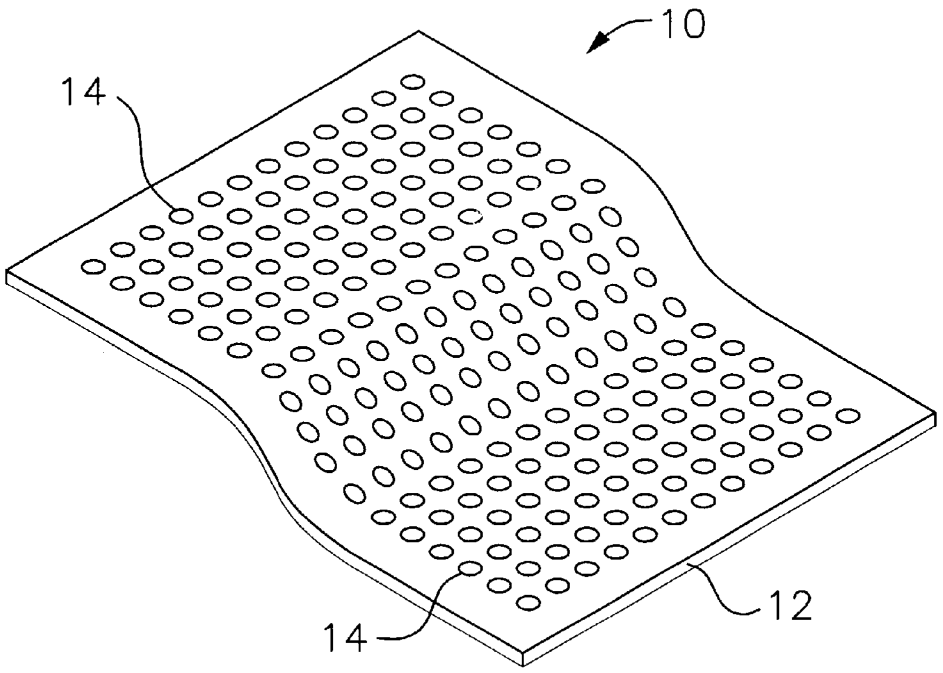
FIG. 1 is a perspective view of an interposer comprising metallic microstructure springs according to the present invention.

The detailed description set forth below in connection with the appended drawings is intended as a description of the presently preferred embodiments of the invention and is not intended to represent the only forms in which the present invention may be constructed or utilized. The description sets forth the functions and the sequence of steps for constructing and operating the invention in connection with the illustrated embodiments. It is to be understood, however, that the same or equivalent functions and sequences may be accomplished by different embodiments that are also intended to be encompassed within the spirit and scope of the invention.

More particularly, the present invention comprises a microstructure spring which is particularly well-suited for use in high density electronic interconnects such as interposers or mezzanine termini. The spring is defined by a resilient structure having a central portion, a peripheral portion and a plurality of bent legs extending between the central portion and the peripheral portion. It is the legs which contribute a substantial portion of the resiliency and spring biasing force. According to one aspect of the present invention, the spring, most particularly the legs thereof, is comprised of alternating layers of copper and nickel.

The problem, i.e., elastomer degradation over time, associated with the use of an elastomer to spring bias the electrical contacts of an interposer are avoided by utilizing metallic springs. Further, the need to harden the metal springs, as is required when phosphor bronze or beryllium copper springs are utilized, is avoided by utilizing microcomposite springs comprised of alternating layers of copper and nickel. As discussed below, the use of such alternating layers of copper and nickel provides a metal spring having desired resiliency, spring constant and durability. Additionally, the use of alternating layers of copper and nickel facilitates control of the mechanical and magnetic properties of a spring by altering the composition, thickness and/or number of alternating layers.

At least one first contact protuberance may optionally be formed upon a first side of the resilient structure at the central portion of the resilient structure and at least one second contact protuberance may optionally be formed upon a second side of the resilient structure at the peripheral portion of the resilient structure.

More particularly, one contact protuberance may be formed upon the first side of the resilient structure at the central portion of the resilient structure and three second contact protuberances may be formed upon the second side of the resilient structure at the peripheral portion of the resilient structure. Typically, the three contact protuberances formed upon the second side of the resilient structure are formed such that they are spaced equidistant from one another and equidistant from the one first contact protuberance formed upon the first side of the resilient structure.

According to one aspect of the present invention, the resilient structure is generally planar in configuration. However, those skilled in the art will appreciate that various other, non-planar, configurations of the resilient structure are likewise suitable.

The legs of the spring are bent, typically such that the legs are curved. For example, the legs may be configured so as to generally define a spiral. The legs extend generally radially from the central portion of the peripheral portion of the resilient structure.

It has been found that by forming the legs so as to be curved, e.g., such that the center line of each leg does not follow a straight line, compliance of the spring is substantially enhanced. Such configuration of the legs provides a true beam structure, as opposed to the structure which would otherwise result from unbent or merely radially extending legs. As those skilled in the art will appreciate, the use of such unbent or merely radially extending legs results in compression and/or tension being applied thereto, so as to generate axial loads therein. Such unbent legs are therefore comparatively stiff and may, in compression, buckle. By way of contrast, the curved legs of the present invention are substantially more compliant and substantially less prone to undesirable collapse or catastrophic failure than is the case when straight, unbent legs are utilized. Moreover, the deformation of such curved legs can be controlled in a manner which minimizes stress and/or strain and which substantially extends the elastic response range thereof, by appropriately selecting design parameters such as curvature and thickness.

According to one aspect of the present invention, the bent legs and the first and second protuberances are configured so as to effect wiping of surfaces to which the first and second protuberances mate. As those skilled in the art will appreciate, wiping of electrical contact surfaces during the mating of electrical connectors is desirable so as to effect penetration of an oxide layer which frequently forms upon the mating surfaces of electrical contacts.

For example, when the spring of the present invention defines the electrical contacts of an interposer, as discussed in detail below, then at least one the first and second protuberances thereof may be utilized to effect electrical connection with the aluminum contact pads of an integrated circuit. Aluminum contact pads frequently have an aluminum oxide layer formed thereupon due to exposure of the aluminum contact pads to atmospheric oxygen. This oxidation layer is a very poor conductor, and therefore substantially inhibits the formation of an adequate electrical connection to the integrated circuit. As such, it is necessary that the oxidation layer be wiped or at least partially removed from the contact pads of the integrated circuit, such that mating contacts may physically contact the aluminum pads of the integrated circuit, so as to assure adequate electrical conduction therewith.

By forming the legs of the spring to be bent, e.g., curved or spiral in configuration, flexing of the legs out of the plane of the generally planar resilient structure inherently causes the leg(s) which are formed upon the central portion of the spring to rotates slightly about a central axis of the spring in a manner which effects wiping as the bending occurs.

Such bending of the legs occurs when the spring is utilized in an interposer, for example, because the manufacturing tolerances associated with the integrated circuit package and/or a printed wiring board to which the integrated circuit package is to be attached generally facilitate non-coplanar construction thereof. Thus, when a plurality of such springs are formed in an planar array, the springs will generally deform so as to conform to the height deviations of the electrical contacts of the integrated circuit package and/or the printed wiring board.

Generally, the resilient structure comprises three bent legs, so as to provide adequate support for the central portion thereof. However, various other numbers of bent legs, e.g., one, two, four, etc., are likewise suitable. It will generally be found that the beneficial wiping action is best achieved when at least two bent legs are provided.

The peripheral member interconnects the bent legs at the peripheral ends of the bent legs. The peripheral member is preferably generally circular in configuration. However, various other alternative configurations, e.g., triangular, square, rectangular, hexagonal, octagonal, etc., may alternatively be utilized. Indeed, the peripheral member need not define any regular geometric shape, but rather may be configured to define substantially any desired shape.

According to one exemplary configuration of the present invention, the bent legs comprise alternating layers of copper and nickel. Optionally, the entire resilient structure, which comprises the central portion, the peripheral portion and the bent legs, is formed as an integral unit and comprises alternating layers of copper and nickel.

Generally, the bent legs comprise between approximately three and approximately ten alternating copper/nickel pair layers. In another configuration, the bent legs on the entire resilient structure comprise thousands of alternating copper/nickel pair layers. According to an exemplary configuration of the present invention, the bent legs comprise approximately six alternating copper/nickel pair layers. Those skilled in the art will appreciate that various other numbers of alternating copper/nickel pair layers are likewise suitable.

Thus, according to one configuration of the present invention, the spring is configured to define a spring terminus which effects electrical interconnection of two electrical devices, such as an integrated circuit and a printed wiring board. The spring terminus of the present invention is thus suitable for use in such applications as interposers and electrical connectors. Various other, related and non-related, applications of the present invention are also contemplated.

As mentioned above, a plurality of the springs of the present invention may be formed in an array upon a generally planar dielectric substrate so as to define an interposer. The dielectric substrate has first and second surfaces.

Optionally, the substrate defines a flexible circuit. The springs provide electrical conductivity between the first and second surfaces of the substrate.

Each spring of such an interposer thus defines or includes the corresponding electrical contact formed upon either side of the substrate. Each spring of the interposer comprises a resilient structure having a central portion, a peripheral portion and a plurality of legs extending between the central portion and the peripheral portion. At least one first contact protuberance is formed upon a first side of the resilient structure at the central portion of the resilient structure to facilitate electrical contact to an integrated circuit, a printed wiring board, or the like and at least one second contact protuberance is formed upon a second side of the resilient structure at the peripheral portion of the resilient structure to facilitate electrical contact to an integrated circuit, a printed wiring board or the like.

The resiliency of the springs, particularly the legs thereof, provides desired compliance, so as to compensate for differences in heights of the electrical contacts of the electrical devices being mated. Additional compliance may be achieved by forming or relieving the substrate of a flexible dielectric material such as KAPTON (a registered trademark of E.I. du Pont de Nemours and Company of Circleville, Ohio), so that each entire spring may move out of the plane of the array of springs in order to further compensate for differences in the heights of the electrical contacts of the mating electrical devices.

Thus, the first protuberances formed upon the first side of each spring and therefor disposed upon a first side of the substrate provide a portion of an electrical path from one electrical device, e.g., an integrated circuit, through the electrical substrate to a second electrical device, e.g., a printed wiring board, via the second protuberances formed upon the second side of each spring and extending from the second side of the substrate.

According to one configuration of the present invention, the legs of each spring comprise alternating layers of copper and nickel. The use of such layers facilitates enhanced control of the mechanical and magnetic properties of the spring. By varying the number of layers, the thickness of the layers, and the metals comprising the layers, the mechanical and magnetic properties of the spring can be more precisely controlled. Alternatively, particularly in those applications not requiring substantial spring biasing force, the springs are formed of a single, generally homogenous layer.

According to an alternative configuration of the present invention, the substrate comprises a rigid substrate and the springs provides substantially all of the compliance.

According to another alternative configuration of the present invention, the substrate comprises a conductive substrate and the springs are electrically insulated from the conductive substrate.

According to one aspect of the present invention, the springs of the present invention are fabricated utilizing contemporary photolithographic and electrodeposition procedures as discussed in detail below. Alternatively, such springs may be formed utilizing other techniques such as sputtering, vapor deposition, electron milling, and/or laser etching.

The ability to fabricate microstructure springs according to the present invention facilitates the use of metal springs which eliminate the need to utilize elastomeric pads or springs which tend to take a compression set and thus degrade over time, particularly when exposed to compressive forces, as discussed above.

Further, the use of microstructure springs having a microcomposite configuration, e.g., comprised of alternating layers of copper and nickel, eliminates the problems associated with the hardening of metal springs, such as phosphor bronze or beryllium copper springs, after formation of the springs upon a polymer substrate. As discussed above, heat hardening of such contemporary phosphor bronze or beryllium copper springs inherently degrades the polymer substrate, due to the temperatures required during the heat hardening process. Microcomposite springs formed according to the present invention do not require such heat hardening, thus allowing them to be used in situations wherein the springs are formed upon or proximate heat-sensitive polymer structures.

Referring now to FIG. 1, an interposer 10 comprises a flexible dielectric substrate 12 formed of a material such as KAPTON, having a 2-dimensional array of metallic microstructure springs 14 formed thereon in a manner which enhances compliance, provides a desired spring biasing force and facilitates electrical conductivity from one side of the substrate 12 to the other side thereof. Compliance is enhanced due to the spring nature or resiliency of the springs 14, which accommodate some variance of the height of electrical contacts of integrated circuits, printed wiring boards and the like. Additional compliance is provided by the flexibility of the substrate 12.

The use of microcomposite springs, e.g., springs comprised of alternating layers of two different metals, provides the fabrication of microstructure springs having a desired spring biasing force. It is thought that the interface or grain boundaries of the adjacent metal layers enhances the spring constant of such microcomposite springs, thus making the springs stiffer. Thus, the use of a plurality of such metal layers, inherently resulting in the formation of a corresponding plurality of such boundaries, enhances the spring biasing force provided by such microcomposite springs.

These springs 14 are formed upon the flexible dielectric substrate 12 in a manner such that at least a portion of each spring 14 extends through an opening 30 (FIG. 4) in the substrate 12 so as to facilitate electrical conduction therethrough. Thus, for example, one or more of the contact protuberances, 24, 22 (FIG.3) extend through the substrate 12 so as to provide an electrical pathway through the substrate 12.

Figure 2:
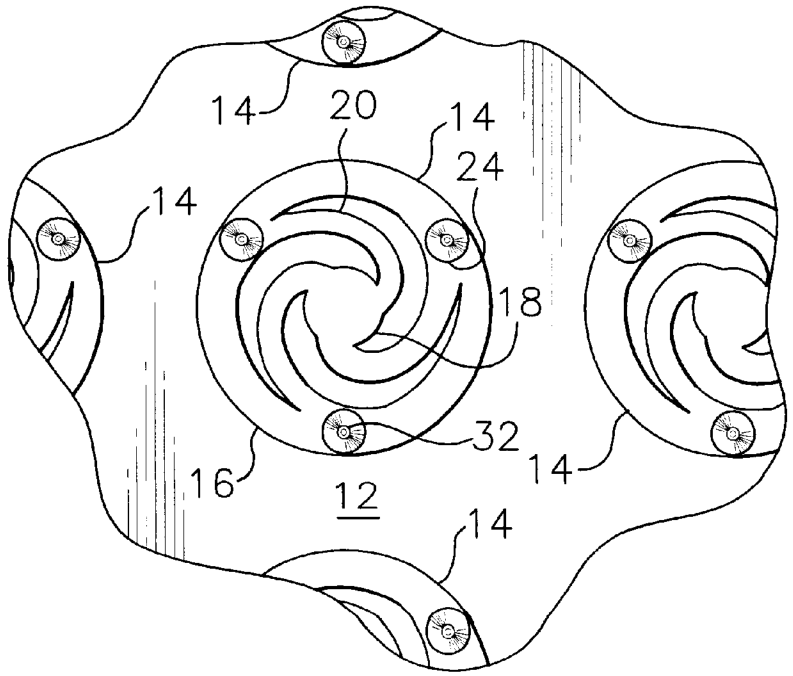
FIG. 2 is an enlarged top view of a portion of the interposer of FIG. 1, better showing the metallic microstructure springs thereof.
Figure 3:
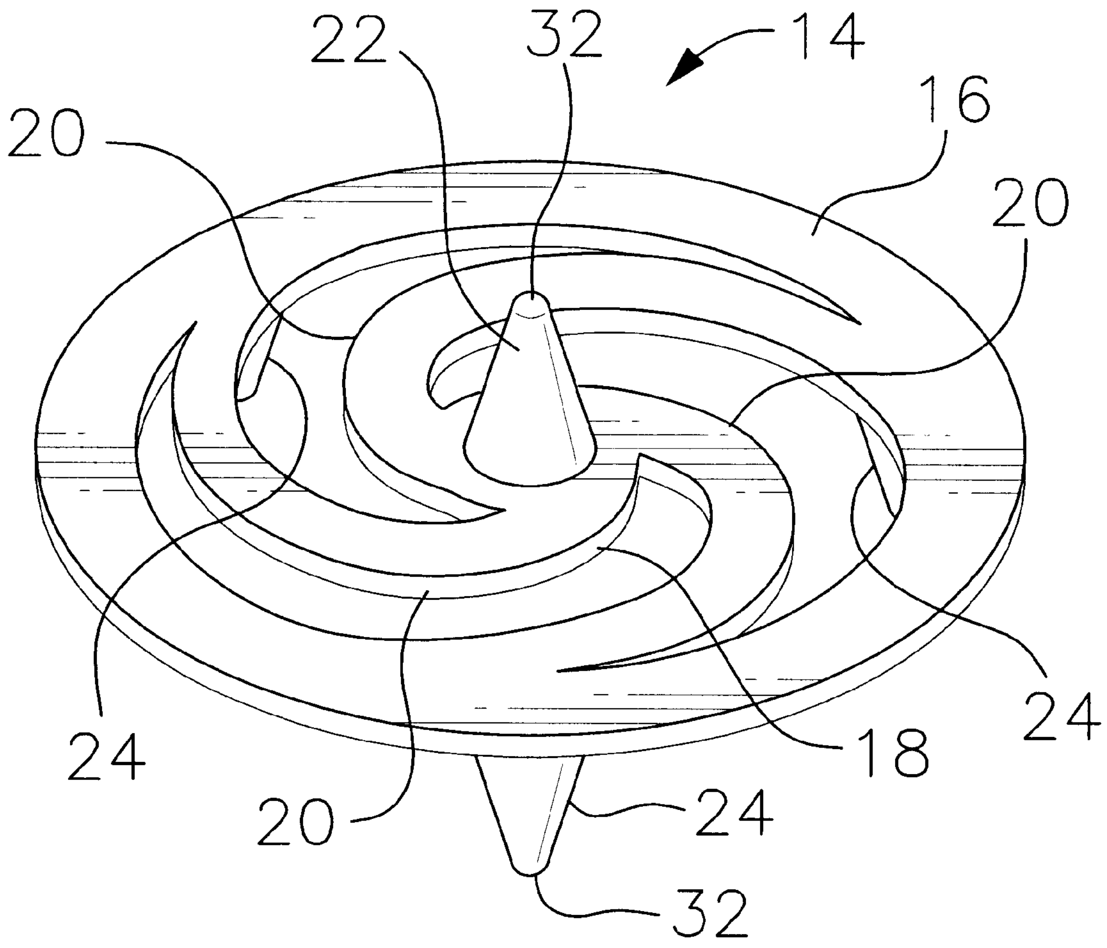
FIG. 3 is a perspective view of a metallic microstructure spring (removed from the substrate of the interposer) according to the present invention.

Referring now to FIGS. 2 and 3, according to one configuration of the present invention, each microstructure spring 14 defines a resilient structure comprising a central portion 18, a peripheral portion 16 and a plurality of bent legs 20. The resiliency of the microstructure spring 14 is contributed to by the bent legs 20 which may be urged out of their planar alignment with the peripheral portion 16, thereby being deformed so as to result in a spring biasing effect. The bent nature of the legs 20 facilitates such deforming thereof out of the plane of the peripheral portion 16. According to one aspect of the present invention, the legs 20 are curved so as to define a generally spiral configuration thereof.

Further, such bent configuration of the legs 20 also causes the central portion to rotate when the legs 20 deform. Such rotation may be used advantageously to effect scraping or penetration of an oxide surface upon a contact of an electrical device to which the spring 14 mates, as described in detail below.

At least one first contact protuberance 22 extends from the central portion 18. Similarly, at least one (three, as shown) second contact protuberance 24 extends from the peripheral portion 16. Although one first contact protuberance 22 and three second contact protuberances 24 are shown in the figures and discussed herein, those skilled in the art will appreciate that any desired number of first and second contact protuberances may be utilized.

The first 22 and second 24 contact protuberances are preferably generally conical in configuration. Thus, each contact protuberance 22, 24 comprises a tip 32 which is sufficiently sharp or pointed as to enhance the ability of the contact protuberance 22, 24 to penetrate the oxidation layer of a contact pad or the like.

Figure 4:
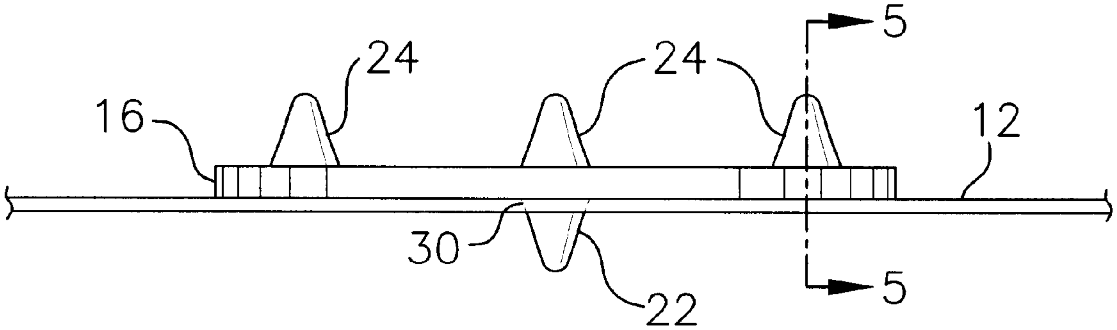
FIG. 4 is a side view of a metallic microstructure spring disposed upon a substrate, such as that of the interposer of FIG. 1.

Referring now to FIG. 4, each microstructure spring 14 is formed upon the flexible dielectric substrate 12, which provides a substrate or base for the electrodeposition of the metals of which the springs 14 are formed. As shown in FIG. 4, the first contact protuberance 22 extends downwardly through opening 30 in the substrate 12. Alternatively, the spring 14 could be formed such that the first contact protuberance 22 extends upwardly and the three second contact protuberances 24 extend downwardly through the substrate 12. As a further alternative, the opening 30 may be enlarged such that the spring 14 is supported by the substrate 12 only at the periphery thereof, so as to facilitate unhampered (by the substrate 12) downward (as shown in FIG. 4) deformation of the legs 20.

By providing a plurality, e.g., three, second contact protuberances 24 at the periphery of the spring 14, each first contact protuberance 22 is fully supported (not cantilevered), such that the desired spring biasing force is more effectively applied.

Figure 5:
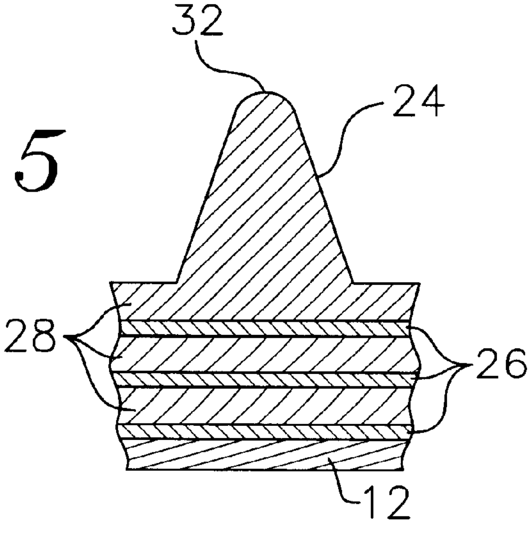
FIG. 5 is an enlarged cross-sectional view, taken along line 5 of FIG. 4, showing the alternating copper and nickel layers of the metallic microstructure spring.
Figure 4A:
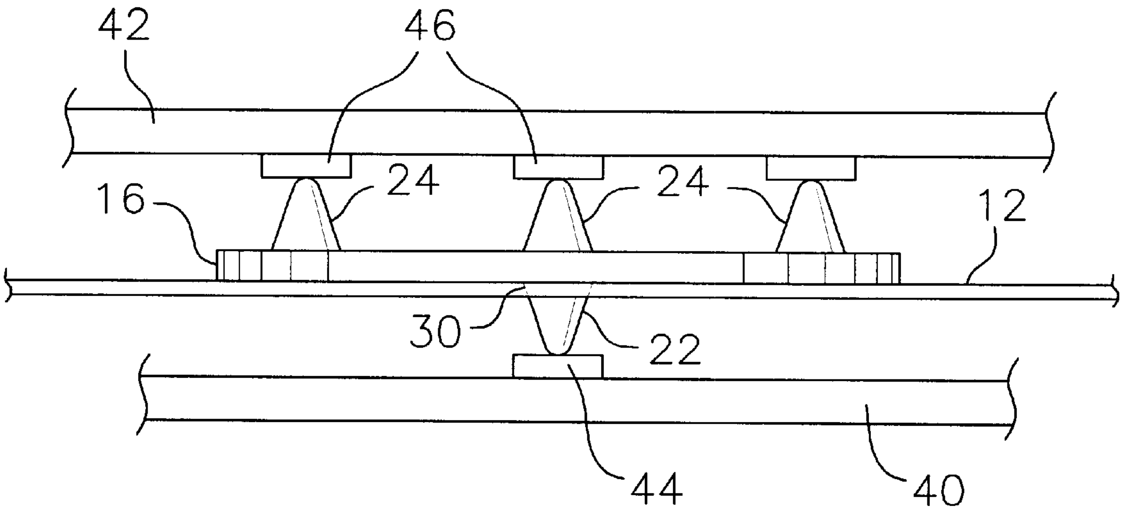

Referring now to FIG. 5, an exemplary microcomposite structure having three nickel layers 26 and three copper layers 28 is shown. The nickel layers 26 and copper layers 28 are formed, in an alternating fashion, upon a KAPTON substrate 12, as discussed in detail below. The first 22 and second 24 contact protuberances may be formed upon either desired one of the alternating nickel 26 and copper 28 layers. As those skilled in the art will appreciate, various methods for forming such contact protuberances 22, 24 are suitable.

For example, the contact protuberances 22, 24 may be formed via electrodeposition, vapor deposition, electron milling, laser etching or any other desired method.

Figure 6:
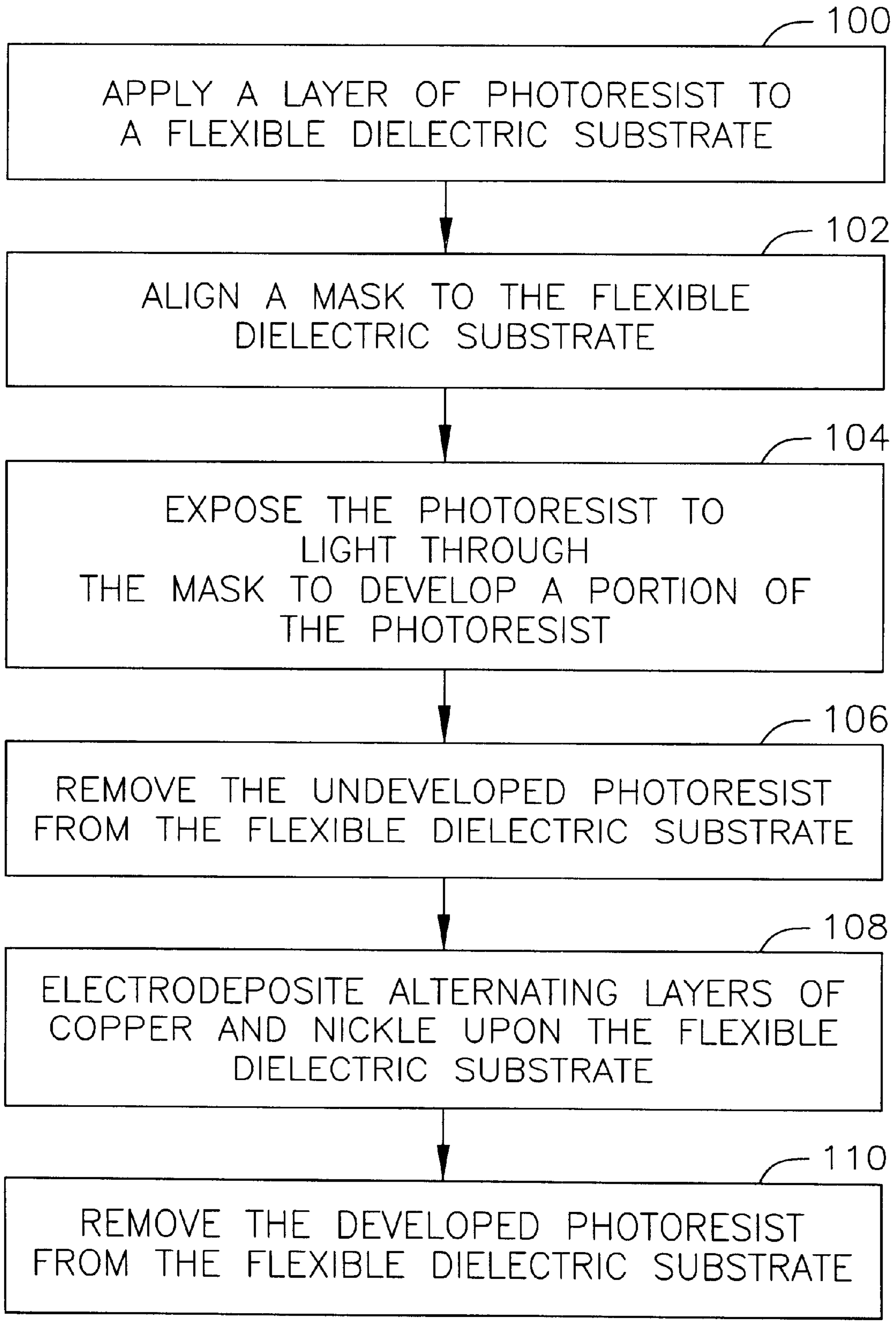
FIG. 6 is a flowchart showing the photolithographic and electrodeposition processes utilized in the fabrication of a metallic microstructure spring according to the present invention.
Figure 7:
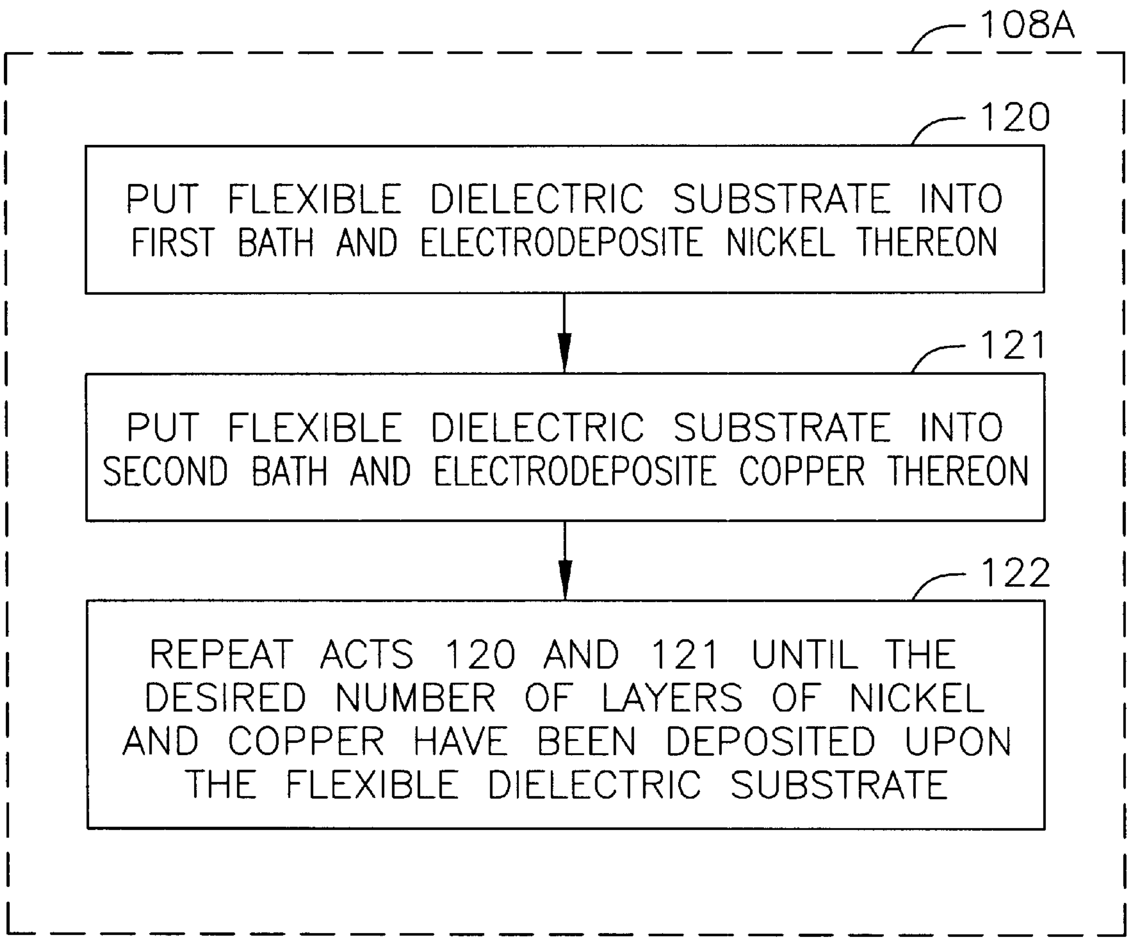
FIG. 7 is a flowchart showing block 108 of FIG. 6 in further detail for a double tank electrodeposition process.
Figure 8:
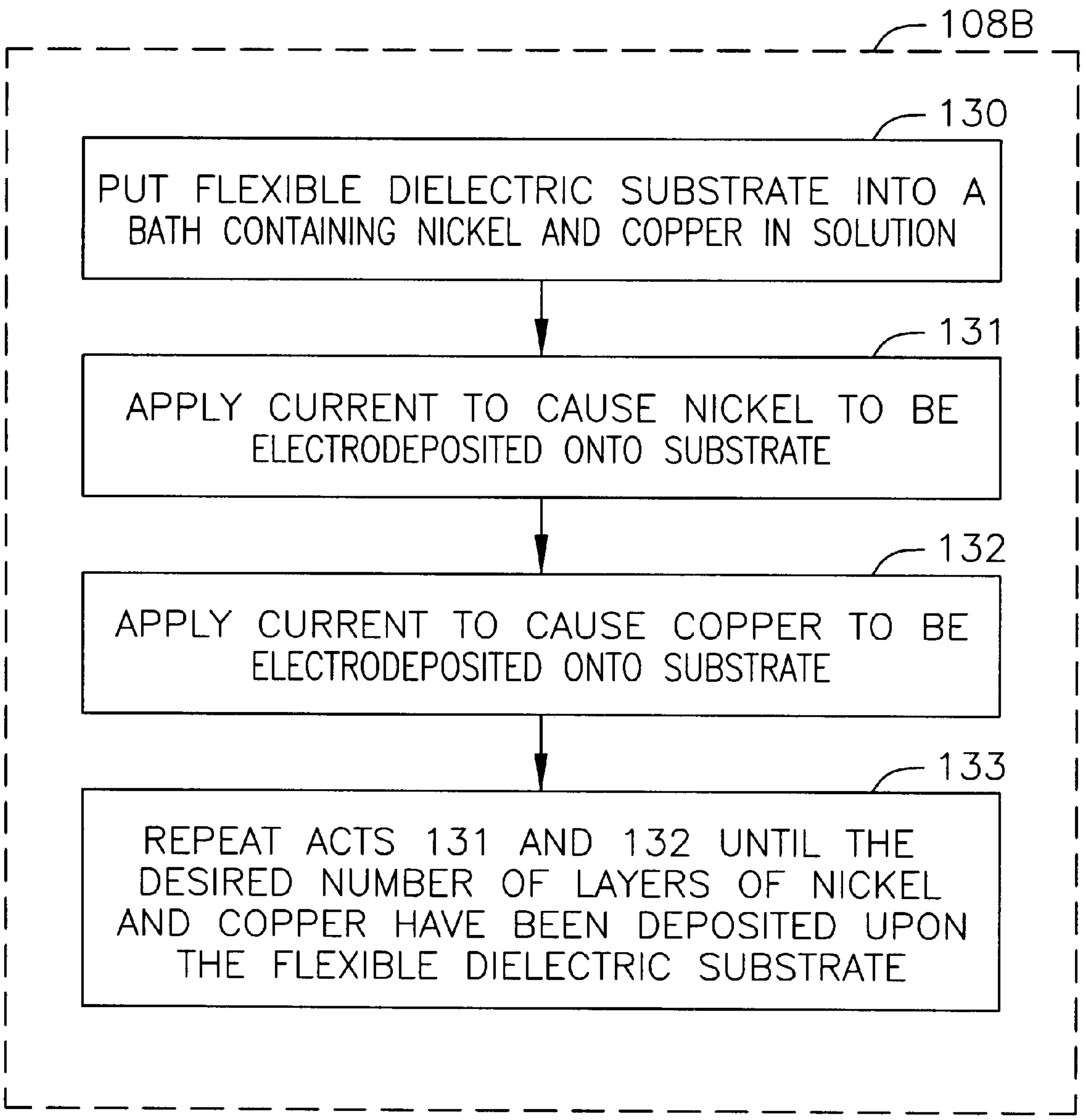
FIG. 8 is a flowchart showing block 108 of FIG. 6 in further detail for a single tank electrodeposition process.

Referring now to FIGS. 6–8, the method for forming microcomposite springs having alternating nickel and copper layers according to the present invention is more particularly shown. As described in detail below, either a double tank electrodeposition or a single tank process may be used to apply the alternating layers of nickel and copper.

With particular reference to FIG. 6, a flowchart of the method for forming microcomposite springs according to the present invention is depicted generally. As shown in block 100, a layer of photoresist is applied to a flexible dielectric substrate. According to one configuration of the present invention, the substrate comprises a sheet of KAPTON, having a thickness of 0.001–0.020 inches. One example of a suitable photoresist is AQ9013, as provided by E.I. du Pont de Nemours and Company of Circleville, Ohio.

As shown by block 102, a mask is aligned to the flexible dielectric substrate. The mask is typically a sheet of photographic film which has been developed so as to define the desired spring pattern thereon. According to the present invention, the spring pattern comprises an array of microstructure springs which are to be formed upon the KAPTON substrate 12.

As shown by block 104, the photoresist is exposed to electromagnetic radiation, such as visible or ultraviolet light, through the mask so as to expose and polymerize a portion of the photoresist. The unexposed photoresist may then be developed away such that the remaining photoresist defines the desired geometry of the spring. Either negative or positive masking, photoresist and development techniques may be utilized, as desired.

As shown in block 106, the undeveloped photoresist is removed or washed from the flexible substrate 12. This process leaves developed photoresist upon those portions of the substrate where it is desired that alternating layers of copper and nickel not be formed.

As shown in block 108, electrodeposition of alternating layers of copper and nickel upon the flexible dielectric substrate is performed so as to result in the formation of an array of microcomposite springs thereon. This electrodeposition process may be performed according to either a two tank procedure or a single tank procedure as described with respect to FIGS. 7 and 8 below.

As shown by block 110, the developed photoresist is removed from the flexible dielectric substrate. Removal of the developed photoresist from the flexible dielectric substrate leaves the alternating layers of copper and nickel which have been formed according to the pattern of the developed photoresist, so as to define the desired array of springs.

With particular reference to FIG. 7, block 108A (one detailed example of block 108 of FIG. 6) shows the electrodeposition process in further detail, wherein two separate tanks are utilized for the electrodeposition of nickel and copper.

As shown in block 120, the flexible dielectric substrate 16 is put into a first bath and nickel is then electrodeposited thereon.

As shown in block 121, the flexible dielectric substrate is moved to a second bath and copper is electrodeposited thereon.

As shown in block 122, this process is repeated until the desired number of layers of nickel and copper have been deposited upon the flexible dielectric substrate.

An exemplary bath for the electrodeposition of nickel upon the KAPTON substrate comprises a solution of nickel sulfate, maintained at a temperature of approximately 110 EF. Electrodeposition is performed by applying a current of approximately 20 ASF amps, at approximately 1.5 volts, for a duration of approximately 16.5 minutes.

An exemplary bath for the electrodeposition of copper upon the KAPTON substrate comprises a solution of copper, maintained at a temperature of approximately 70 EF. Electrodeposition is performed by applying a current of approximately 22 ASF amps, at approximately 1.5 volts, for a duration of approximately 2.5 minutes.

The use of electrodeposition parameters which result in the formation of copper layers having a thickness of approximately 0.00001 inch and nickel layers having a thickness of approximately 0.00001 inch is desired according to an exemplary embodiment of the present invention. Thus, the copper layers and the nickel layers may have substantially identical thickness, if desired.

With particular reference to FIG. 8, block 108B (another detailed example of block 108 of FIG. 6) shows the electrodeposition in further detail, wherein a single tank is utilized for the electrodeposition of nickel and copper.

As shown in block 130, the flexible dielectric substrate 16 is put into a bath containing both nickel and copper in solution, as described in detail below.

As shown in block 131, current is applied so as to cause nickel to be electrodeposited onto the substrate.

As shown in block 132, current is applied so as to cause copper to be electrodeposited onto the substrate.

As shown in block 133, this process is repeated until the desired number of layers of nickel and copper, each layer having a desired thickness, have been deposited upon the flexible dielectric substrate.

An exemplary bath for the electrodeposition of both nickel and copper upon the KAPTON substrate utilizing a single tank comprises a solution of approximately 500–5,000 grams of nickel sulfamate, preferably approximately 1,850 grams of nickel sulfamate $4 $H_2O$; approximately 1–100 grams of copper sulfate, preferably approximately 13 grams of copper sulfate $5$H_2O$; approximately 10–500 grams of boric acid, preferably approximately 111 grams of boric acid, all in an aqueous solution of approximately 1 gigaliter of water. Optionally, approximately 50 grams of a surfactant such as sodium laurel sulfate or SNAP may be added to mitigate pitting.

The bath is preferably maintained at a temperature of approximately 120 EF.

Electrodeposition of the nickel is preferably performed by applying a current of approximately 30 ASF amps, at approximately 0.5 volts for a duration of approximately 1 second.

Electrodeposition of the copper is preferably performed by applying a current of approximately 3 ASF amps, at approximately 0.2 volts for a duration of approximately 10 seconds.

According to the present invention, the thickness of the nickel and copper layers can be varied by varying the current, voltage and/or duration of electrodeposition.

The use of the above-described single tank electrodeposition process for forming layers of nickel and copper may be utilized to form copper layers having a thickness of approximately 0.00001 inch and nickel layers having a thickness of approximately 0.00001 inch, according to an exemplary embodiment of the present invention.

Utilizing the single tank electrodeposition process according to the present invention facilitates the fabrication of metallic microstructure springs having a large number, e.g., in excess of 10,000, layers. Thus, according to the present invention, the spring or tensile properties of the spring, as well as the magnetic properties thereof, may be varied, as desired. According to the present invention, between approximately 1,000 and approximately 10,000, e.g., 5,000, alternating copper/nickel pair layers may be formed.

Generally, the two tank electrodeposition process is suitable for forming a small number, e.g., up to 10, of alternating layer pairs and the single tank electrodeposition process is suitable for forming a larger number, e.g., 1,000–10,000, of alternating layer pairs.

Those skilled in the art will appreciate that various other parameters may similarly be utilized so as to provide alternating layers of copper and nickel having different thicknesses. For example, the duration of each electrodeposition procedure may be increased, so as to correspondingly increase the thickness of the copper and/or nickel layers.

Thus, according to the present invention, microcomposite springs are formed upon a flexible substrate utilizing conventional photolithographic and electrodeposition techniques. The microcomposite springs of the present invention are suitable for use in such applications as interposers and for attaching various electronic devices to one another. For example, wafer scale integration (WSI), chip scale packaging (CSP) and various other minimalist-type integrated circuit packaging methodologies may utilize the microstructure spring termini of the present invention. Further, such spring termnini may find application in integrated circuit test equipment, wherein repeated attachment and removal of the device under test is required.

The process of the present invention may alternatively be utilized to define tag ID=s (taggants). As those skilled in the art will appreciate, such taggants are utilized to identify the manufacturer of an explosive, as well as possibly distributors and customers thereof. Taggants may therefore be utilized to define suspects in illegal bombings, wrongful shootings and the like.

According to one aspect of the present invention, the photolithic process may be utilized to define a variety of different shapes, such as triangles, squares, rectangles, circles, etc., of the layered structure. Further, the layers themselves may be formed, e.g., electrodeposited, so as to have a distinct series of thicknesses, in a bar code-like fashion, so as to provide distinct identifications. When such uniquely defined microcomposite structures are added to explosives or propellants, they may provide an indication as to the source of the propellant or explosive to aid in later forensic analysis.

It is to be understood that the exemplary microstructure springs described herein and shown in the drawings represent only presently preferred embodiments of the invention. Indeed, various modifications and additions may be made to such embodiments without departing from the spirit and scope of the invention. For example, various different metals may be utilized to form the alternating layers of the microcomposite springs. Further, various different substrates, including rigid and/or metallic substrates may be utilized. Thus, these and other modifications and additions may be obvious to those skilled in the art and may be implemented to adapt the present invention for use in a variety of different applications.

What is claimed is:

1. A microcomposite spring comprising:

a plurality of layers of alternating copper and nickel metals formed to one another such that grain boundaries of the alternating copper and nickel metals enhance a spring constant thereof and wherein the layers are configured to define a spring, and wherein the spring comprises a central portion that is substantially coplanar with at least one spring leg.

2. A spring comprising:

a resilient structure having a central portion, a peripheral portion and a plurality of bent legs extending between the central portion and the peripheral portion; and wherein the bent legs comprise alternating layers of copper and nickel and are substantially coplanar with the peripheral portion.

3. The spring as recited in claim 2, wherein the bent legs comprise between approximately three and approximately ten alternating copper/nickel pair layers.

4. The spring as recited in claim 2, wherein the bent legs comprise between approximately 1,000 and approximately 10,000 alternating copper/nickel pair layers.

5. The spring as recited in claim 2, wherein the bent legs comprise approximately six alternating copper/nickel pair layers.

6. The spring as recited in claim 2, wherein the bent legs comprise approximately 5,000 alternating copper/nickel pair layers.

7. The spring as recited in claim 2, further comprising:

at least one first contact protuberance formed upon a first side of the resilient structure at the central portion of the resilient structure; and at least one second contact protuberance formed upon a second side of the resilient structure at the peripheral portion of the resilient structure.

8. The spring as recited in claim 2, wherein the resilient structure is generally planar.

9. The spring as recited in claim 2, wherein the legs are curved.

10. The spring as recited in claim 2, wherein the legs are configured so as to generally define a spiral.

11. The spring as recited in claim 2, wherein the legs extend generally radially from the central portion to the peripheral portion of the resilient structure.

12. The spring as recited in claim 7, wherein the bent legs and at least one of the first and second protuberances are configured so as to effect wiping of surfaces to which at least one of the first and second protuberances mate.

13. The spring as recited in claim 7, wherein the first contact protuberance comprises one contact protuberance.

14. The spring as recited in claim 7, wherein the second contact protuberance comprises three contact protuberances.

15. The spring as recited in claim 2, wherein the plurality of bent legs comprises three bent legs.

16. The spring as recited in claim 7, wherein the second contact protuberance is configured so as to fully support the first contact protuberance.

17. A spring terminus comprising:

a resilient structure having a central portion, a peripheral portion and a plurality of bent legs extending between the central portion and the peripheral portion; said bent legs comprising alternating layers of metals;

at least one first contact protuberance formed upon a first side of the resilient structure at the central portion of the resilient structure;

at least one second contact protuberance formed upon a second side of the resilient structure; and wherein said second contact protuberance is formed on at least one of the central portion or the peripheral portion.

18. The spring terminus as recited in claim 17, wherein the resilient structure is generally planar.

19. The spring terminus as recited in claim 17, wherein the legs are curved.

20. The spring terminus as recited in claim 17, wherein the legs are configured so as to generally define a spiral.

21. The spring terminus as recited in claim 17, wherein the legs extend generally radially from the central portion to the peripheral portion of the resilient structure.

22. The spring terminus as recited in claim 17, wherein the bent legs and at least one of the first and second protuberances are configured so as to effect wiping of surfaces to which at least one of the first and second protuberances mate.

23. The spring terminus as recited in claim 17, wherein the first contact protuberance comprises one contact protuberance.

24. The spring terminus as recited in claim 17, wherein the second contact protuberance comprises three contact protuberances.

25. The spring terminus as recited in claim 17, wherein the plurality of bent legs comprises three bent legs.

26. The spring terminus as recited in claim 17, further comprising a peripheral member interconnecting a plurality of the bent legs at the peripheral end of the bent legs.

27. The spring terminus as recited in claim 17, wherein the second contact protuberance is configured so as to fully support the first contact protuberance.

28. The spring terminus as recited in claim 17, wherein the bent legs comprise a plurality of alternating layers of copper and nickel.

29. The spring terminus as recited in claim 17, wherein the bent legs comprise between approximately three and approximately ten alternating copper/nickel layer pairs.

30. The spring terminus as recited in claim 17, wherein the bent legs comprise between approximately 1,000 and approximately 10,000 alternating copper/nickel layer pairs.

31. The spring terminus as recited in claim 17, wherein the bent legs comprise approximately six alternating copper/nickel layer pairs.

32. The spring terminus as recited in claim 17 wherein the bent legs comprise approximately 5,000 alternating copper/nickel layer pairs.

33. An interposer comprising:

a generally planar dielectric substrate having first and second surfaces;

a plurality of springs disposed upon the substrate so as to define an array of springs, wherein at least one of the springs comprises:

a resilient structure having a central portion, a peripheral portion and a plurality of bent legs extending between the central portion and the peripheral portion; said bent legs comprising a plurality of grain boundaries of different metals;

at least one first contact protuberance formed upon a first side of the resilient structure at the central portion of the resilient structure; and at least one second contact protuberance formed upon a second side of the resilient structure.

34. The interposer as recited in claim 33, wherein the substrate comprises a flexible substrate.

35. The interposer as recited in claim 33, wherein the substrate comprises at least one of polyimide film and polyester film.

36. The interposer as recited in claim 33, wherein each of the springs is configured so as to provide electrical and thermal conduction from the first surface of the substrate to the second surface thereof.

37. The interposer as recited in claim 33, wherein the substrate defines a flexible circuit.

38. The interposer as recited in claim 33, wherein the springs comprise a generally planar, two-dimensional array of springs.

39. An interposer comprising:

a generally planar substrate having first and second surfaces;

a plurality of springs disposed upon the substrate so as to define an array of springs, wherein at least one of the springs comprises:

a plurality of legs attached to one another at the central portion so as to define a resilient structure, the legs comprising alternating layers of copper and nickel;

at least one first contact protuberance formed upon a first side of the resilient structure at a central portion of the resilient structure; and at least one second contact protuberance formed upon a second side of the resilient structure.

40. The interposer as recited in claim 39, wherein the substrate comprises a rigid substrate.

41. The interposer as recited in claim 39, wherein the substrate comprises a conductive substrate and wherein the springs are electrically insulated from the conductive substrate.

42. The interposer as recited in claim 39, wherein the substrate comprises a flexible substrate.

43. The interposer as recited in claim 39, wherein the substrate comprises a dielectric film.

44. The interposer as recited in claim 39, wherein each of the springs is configured so as to provide electrical conduction from the first surface of the substrate to the second surface thereof.

45. The interposer as recited in claim 39, wherein the substrate defines a flexible circuit.

46. The interposer as recited in claim 39, wherein the springs comprise a generally planar, two-dimensional array of springs.

47. An interposer for attaching an integrated circuit to a substrate, the interposer comprising:

a generally planar substrate having first and second surfaces;

a plurality of springs disposed upon the substrate so as to define a two dimensional array thereof, wherein each of the springs comprise:

a plurality of bent legs attached to one another so as to define a resilient structure having a central portion and a peripheral portion, the legs extending from the central portion to the peripheral portion of the resilient structure and the legs comprising alternating layers of copper and nickel;

at least one first contact protuberance formed upon a first side of the resilient structure at the central portion of the resilient structure;

at least one second contact protuberance formed upon a second side of the resilient structure at the peripheral portion of the resilient structure; and wherein the first contact protuberances are configured to provide electrical connection to an integrated circuit and wherein the second contact protuberances are configured to provide electrical to a printed wiring board.

48. An electronic assembly comprising:

first and second electronic subassemblies;

an interposer disposed intermediate the first and second electronic subassemblies for providing enhanced electrical communication therebetween, the interposer comprising:

a generally planar substrate having first and second surfaces;

a plurality of springs disposed upon the substrate so as to define an array of springs, wherein at least one of the springs comprises:

a resilient structure having a central portion, a peripheral portion and a plurality of bent legs extending between the central portion and the peripheral portion; said bent legs comprising alternating layers of metals;

at least one first contact protuberance formed upon a first side of the resilient structure at the central portion of the resilient structure; and at least one second contact protuberance formed upon a second side of the resilient structure.

49. The electronic assembly as recited in claim 48, wherein at least one of the first and second electronic subassemblies comprises an electronic subassembly selected from the group consisting of:

a printed wiring board;

a flexible circuit;

a packaged integrated circuit; and an integrated circuit die.

50. An electronic assembly comprising:

first and second electronic subassemblies;

an interposer disposed intermediate the first and second electronic subassemblies for providing enhanced electrical communication therebetween, the interposer comprising:

a generally planar substrate having first and second surfaces;

a plurality of springs disposed upon the substrate so as to define an array of springs, wherein at least one of the springs comprises:

a plurality of legs attached to one another at a central portion so as to define a resilient structure, the legs comprising alternating layers of copper and nickel;

at least one first contact protuberance formed upon a first side of the resilient structure at the central portion of the resilient structure; and at least one second contact protuberance formed upon a second side of the resilient structure.

51. The electronic assembly as recited in claim 50, wherein at least one of the first and second electronic subassemblies comprises an electronic subassembly selected from the group consisting of:

a printed wiring board;

a flexible circuit;

a packaged integrated circuit; and an integrated circuit die.

52. An electronic assembly formed by a process comprising:

providing first and second electronic assemblies;

disposing an interposer intermediate the first and second electronic assemblies so as to provide electrical communication therebetween, the interposer comprising:

a generally planar substrate having first and second surfaces;

a plurality of springs disposed upon the substrate so as to define an array of springs, wherein at least one of the springs comprises:

a plurality of bent legs attached to one another so as to define a resilient structure having a central portion and a peripheral portion, the legs extending from the central portion to the peripheral portion of the resilient structure and comprising a plurality of grain boundaries of different metals;

at least one first contact protuberance formed upon a first side of the resilient structure at the central portion of the resilient structure; and at least one second contact protuberance formed upon a second side of the resilient structure at the peripheral portion of the resilient structure.

53. The electronic assembly as recited in claim 52, wherein at least one of the first and second electronic subassemblies comprises an electronic subassembly selected from the group consisting of:

a printed wiring board;

a flexible circuit; and an integrated circuit.

54. An electronic assembly formed by a process comprising:

providing first and second electronic subassemblies;

disposing an interposer intermediate the first and second electronic subassemblies for providing enhanced electrical communication therebetween, the interposer comprising:

a generally planar substrate having first and second surfaces;

a plurality of springs disposed upon the substrate so as to define an array of springs, wherein at least one of the springs comprises:

a plurality of legs attached to one another at a central portion so as to define a resilient structure, the legs comprising alternating layers of copper and nickel;

at least one first contact protuberance formed upon a first side of the resilient structure at the central portion of the resilient structure; and at least one second contact protuberance formed upon a second side of the resilient structure.

55. The electronic assembly as recited in claim 54, wherein at least one of the first and second electronic subassemblies comprises an electronic subassembly selected from the group consisting of:

a printed wiring board;

a flexible circuit; and an integrated circuit.

56. The electronic assembly as recited in claim 54, wherein the legs are formed by moving a substrate back and forth between a copper bath and a nickel bath.

57. The electronic assembly as recited in claim 54, wherein the legs are formed by disposing a substrate within a bath containing both copper and nickel.

58. A method for enhancing electrical contact between first and second electronic assemblies, the method comprising:

disposing an interposer intermediate the first and second electronic assemblies so as to provide electrical communication therebetween, the interposer comprising:

a generally planar substrate having first and second surfaces;

a plurality of springs disposed upon the substrate so as to define an array of springs, wherein at least one of the springs comprises:

a resilient structure having a central portion, a peripheral portion and a plurality of bent legs extending between the central portion and the peripheral portion; said bent legs comprising alternating layers of metals;

at least one first contact protuberance formed upon a first side of the resilient structure at the central portion of the resilient structure; and at least one second contact protuberance formed upon a second side of the resilient structure.

59. The method as recited in claim 58, wherein at least one of the first and second electronic subassemblies comprises an electronic subassembly selected from the group consisting of:

a printed wiring board;

a flexible circuit; and an integrated circuit.

60. An electronic assembly comprising:

first and second electronic subassemblies;

an interposer disposed intermediate the first and second electronic subassemblies for providing enhanced electrical communication therebetween, the interposer comprising:

a generally planar substrate having first and second surfaces;

a plurality of metallic springs disposed upon the substrate, so as to define an array of springs, wherein at least one of the springs comprises:

a plurality of legs attached to one another at a central portion so as to define a resilient structure, the legs comprising alternating layers of copper and nickel;

at least one first contact protuberance formed upon a first side of the resilient structure at the central portion of the resilient structure; and a plurality of contact protuberances formed upon a second side of the resilient structure.

61. The electronic assembly as recited in claim 60, wherein at least one of the first and second electronic subassemblies comprises an electronic subassembly selected from the group consisting of:

a printed wiring board;

a flexible circuit; and an integrated circuit.

* * * * *